United States Patent
Ho et al.

(10) Patent No.: US 7,863,658 B2
(45) Date of Patent: Jan. 4, 2011

(54) CMOS IMAGE SENSOR AND METHOD FOR FABRICATION THEREOF

(76) Inventors: Won-Joon Ho, 1 Hyangjeong-dong, Heungbuk-gu, Cheongju-si, Chungcheongbuk-do, 361-725 (KR); Kyung-Lak Lee, 1 Hyangjeong-dong, Heungbuk-gu, Cheongju-si, Chungcheongbuk-do, 361-725 (KR)

( * ) Notice: Subject to any disclaimer, the term of this patent is extended or adjusted under 35 U.S.C. 154(b) by 119 days.

(21) Appl. No.: 11/452,296

(22) Filed: Jun. 14, 2006

(65) Prior Publication Data

US 2006/0284273 A1  Dec. 21, 2006

(30) Foreign Application Priority Data

Jun. 17, 2005  (KR)  ............... 10-2005-0052352

(51) Int. Cl.
  *H01L 29/76* (2006.01)
(52) U.S. Cl. .................. 257/288; 257/E29.264
(58) Field of Classification Search .......... 257/E29.264, 257/288
  See application file for complete search history.

(56) References Cited

U.S. PATENT DOCUMENTS

| | | | |
|---|---|---|---|
| 6,548,859 B2* | 4/2003 | Maegawa | 257/327 |
| 6,914,295 B2* | 7/2005 | Chau et al. | 257/333 |
| 2002/0003256 A1 | 1/2002 | Maegawa | 257/328 |
| 2002/0014666 A1* | 2/2002 | Ohmi et al. | 257/368 |
| 2003/0008450 A1 | 1/2003 | Tsai et al. | |
| 2004/0188727 A1* | 9/2004 | Patrick | 257/292 |
| 2004/0209463 A1* | 10/2004 | Kim et al. | 438/666 |
| 2004/0219802 A1* | 11/2004 | Park et al. | 438/780 |
| 2005/0040444 A1* | 2/2005 | Cohen | 257/288 |
| 2005/0104096 A1* | 5/2005 | Lee et al. | 257/288 |

FOREIGN PATENT DOCUMENTS

| | | |
|---|---|---|
| CN | 1012310 | 4/1991 |
| CN | 1171315 | 10/2004 |
| TW | 497272 | 8/2002 |

* cited by examiner

*Primary Examiner*—Bradley K Smith
*Assistant Examiner*—Alexander Belousov
(74) *Attorney, Agent, or Firm*—McAndrews, Held & Malloy, Ltd.

(57) ABSTRACT

There are provided a CMOS image sensor and a method for fabrication thereof. The CMOS image sensor having a reset transistor, a select transistor, a drive transistor and a photodiode, includes an active region in shape of a line, a gate electrode of the drive transistor, which is intersected with the active region, a blocking layer interposed between the active region and the gate electrode in which the blocking layer is formed on an intersection region of the active region and the gate electrode, and a metal contact electrically connected to the gate electrode, wherein the metal contact is not electrically connected to the active region by the blocking layer.

20 Claims, 7 Drawing Sheets

US 7,863,658 B2

CMOS IMAGE SENSOR AND METHOD FOR FABRICATION THEREOF

FIELD OF THE INVENTION

The present invention relates to an image sensor, and more particularly, to a complementary metal oxide semiconductor (CMOS) image sensor including a unit pixel configured with three or four transistors capable of preventing the back bias characteristic of a drive transistor and the matching property of the threshold voltage from being deteriorated, and a method for fabrication thereof.

DESCRIPTION OF RELATED ART

As is well known, an image sensor is a semiconductor device that converts an optical image into an electrical signal. The image sensor is mainly classified into a charge coupled device (CCD) and a complementary metal oxide semiconductor (CMOS) image sensor. In the CCD, respective MOS capacitors are arranged such that they are very close to one another, and charge carriers are stored at the capacitor and they are transferred.

On the contrary, the CMOS image sensor includes a plurality of unit pixels by employing a semiconductor CMOS process, wherein the unit pixel is configured with one photodiode and three or four transistors for driving the unit pixel. Meanwhile, a CMOS technology is applied to the fabrication of the CMOS image sensor such that a control circuit and a signal processing circuit are used as a peripheral circuit, and a plurality of MOS transistors are provided for driving a number of the unit pixels. Therefore, the CMOS image sensor employs a switching scheme for successively detecting outputs using the peripheral circuit and the MOS transistors.

In fabricating these various image sensors, many endeavors have been undertaken to improve the photosensitivity of the image sensor, of which one is a light-condensing technology. The CMOS image sensor is configured with the photodiode for sensing an incident light from an object and a CMOS logic circuitry for processing the light sensed at the photodiode into a predetermined electric signal and creating data corresponding to the electric signal. Therefore, in order to improve the photosensitivity, many attempts have been made to increase an occupation ratio of a photodiode area with respect to a total area of the image sensor, which is typically called a fill factor.

FIG. 1 is a circuit diagram setting forth a unit pixel of a conventional CMOS image sensor, in which one unit pixel includes four transistors. In the unit pixel of the conventional CMOS image sensor as depicted in FIG. 1, a sub-micron CMOS epitaxial process is used in order to improve the photosensitivity and reduce the crosstalk between the unit pixels.

The unit pixel (U/C) of the conventional CMOS image sensor includes a photodiode PD with a PNP junction, a PNPN junction or the like, a transfer transistor Tx, a floating diffusion node FD, a reset transistor Rx, a drive transistor Dx and a select transistor Sx. The photodiode PD receives the light from the object to generate corresponding electron-hole pairs, i.e., photogenerated charges. The transfer transistor Tx transfers the photogenerated charges accumulated at the photodiode PD to the floating diffusion node FD when the transfer transistor Tx is turned on. The floating diffusion node FD receives the photogenerated charges transferred from the transfer transistor Tx when the transfer transistor Tx is turned on. The reset transistor Rx resets the floating diffusion node FD to be a power voltage VDD level in response to a reset signal. In the drive transistor Dx, the amount of turning on a drive gate is varied with an electric signal corresponding to the photogenerated charges transferred from the floating diffusion node FD so that the drive transistor Dx outputs the electric signal in proportion to the amount of the photogenerated charges. The select transistor Sx, which is turned on in response to a select signal, outputs a predetermined signal of the unit pixel outputted through the drive transistor Dx. A denotation Lx represents a load transistor and the floating diffusion node FD has a predetermined capacitance Cfd.

An operational principle for achieving an output voltage from the unit pixel having the above conventional configuration will be set forth more fully herebelow. First, the transfer, the reset and the select transistors Tx, Rx and Sx are turned off. At this time, the photodiode PD is in a full depletion state. A light-condensing begins so that the photogenerated charges are accumulated at the photodiode PD.

After the floating diffusion node FD is reset as the reset transistor Rx is turned on, the select transistor Sx is turned on so as to measure an output voltage V1 of the unit pixel in a reset operation. This measured value means only a direct current (DC) voltage level shift of the floating diffusion node FD. After with a lapse of an appropriate light-condensing time, all the photogenerated charges accumulated at the photodiode PD are transferred to the floating diffusion node FD when the transfer transistor Tx is turned on. Afterwards, the transfer transistor Tx is turned off. An output voltage V2 owing to the charges transferred to the floating diffusion node FD is measured.

An output voltage V1-V2, which is a transfer result of the photogenerated charges, is obtained from a difference between the output voltages V1 and V2. That is, the output voltage V1-V2 is purely a signal voltage in which a noise is excluded. This method is referred to as a correlated double sampling (CDS). Afterwards, the above processes are repeated.

FIG. 2 is a plane view illustrating the unit pixel of FIG. 1 including the drive transistor Dx. An active region ACT is formed in shape of a line. A P-well (not shown) is disposed in a predetermined region of the active region ACT, and the drive transistor Dx is arranged over the P-well. The drain of the drive transistor Dx is connected to the power voltage VDD and the source of the select transistor Sx (not shown) is connected to an output node (not shown). The drive transistor Dx incorporates a gate G crossing over the P-well. The square-shaped photodiodes PD are arranged on both sides of the active region ACT. The transfer transistor Tx is disposed on one side of the photodiode PD.

There exists a single amplifier acting as a source follower in each unit pixel of the CMOS image sensor, which is the drive transistor Dx. In the drive transistor Dx, the gate terminal and the drain terminal are used as input ports and the source terminal and the drain terminal are used as output ports. In the CMOS image sensor, the accumulated charges of the sensing node are inputted through input terminals, i.e., a voltage corresponding to the accumulated charges is applied through the gate of the drive transistor, and an output voltage is varied with the amount of the accumulated charges. Therefore, the brightness is varied with the amount of the incident light. Through this manner, a final image can be displayed in the CMOS image sensor.

The characteristics of the drive transistor Dx, i.e., the source follower, have a great effect on the image. In particular, the matching property of the drive transistor between the pixels is very important. However, as the pixel should be scaled down to meet the demand of a highly integrated device, the conventional drive transistor Dx has a problem in that the matching property of the threshold voltage may be deteriorated due to the reduction of the width of the active region ACT and the back bias effect. As a result, the noise occurs due to the deterioration of the matching property of the drive transistor Dx so that the image quality is degraded after all.

As the pixel is scaled down, a size A is generally required to be reduced. In addition, because a width C of the active region ACT is determined in consideration of a minimum size on the basis of the design rule, the threshold voltage may severely roll due to the deterioration of the matching property. As a size D of the photodiode PD decreases, the fill factor decreases correspondingly, and this results in degrading of the image quality. Besides, since a first metal contact M1C is allowable only within a predetermined region upon a field oxide layer considering the reliability of a gate oxide layer, there is a limitation in scaling down the pixel due to the limitation of a size B.

SUMMARY OF THE INVENTION

It is, therefore, an object of the present invention to provide a complementary metal oxide semiconductor (CMOS) image sensor which can prevent the matching property of a drive transistor from being deteriorated which is attributable to the downscale of the image sensor, and securing the reliability of a first metal contact for the gate of the drive transistor, and a method for fabrication thereof.

In accordance with an aspect of the present invention, there is provided a CMOS image sensor including a reset transistor, a select transistor, a drive transistor and a photodiode, the CMOS image sensor including: an active region in shape of a line; a gate electrode of the drive transistor, the gate electrode being intersected with the active region; a blocking layer interposed between the active region and the gate electrode, formed on an intersection region of the active region and the gate electrode; and a metal contact electrically connected to the gate electrode, wherein the metal contact is not electrically connected to the active region by the blocking layer.

In accordance with another aspect of the present invention, there is provided a CMOS image sensor including a transfer transistor, a reset transistor, a select transistor, a drive transistor and a photodiode, the CMOS image sensor including: an active region in shape of a line; a gate electrode of the drive transistor, the gate electrode being intersected with the active region; a blocking layer interposed between the active region and the gate electrode, formed on an intersection region of the active region and the gate electrode; and a metal contact electrically connected to the gate electrode, wherein the metal contact is not electrically connected to the active region by the blocking layer.

In accordance with still another aspect of the present invention, there is provided a CMOS image sensor including a reset transistor, a select transistor, a drive transistor and a photodiode, the CMOS image sensor including: a field oxide layer in shape of a trench formed in a substrate to define an active region; a trench with a predetermined depth formed by removing a portion of the field oxide layer adjacent to the active region; a gate oxide layer formed on sidewalls of the active region exposed by the trench; a blocking layer formed on the active region; a gate electrode formed over the trench and the blocking layer; and a metal contact electrically connected to the gate electrode, wherein the metal contact is not electrically connected to the active region by the blocking layer.

In accordance with further aspect of the present invention, there is provided a CMOS image sensor including a transfer transistor, a reset transistor, a select transistor, a drive transistor and a photodiode, the CMOS image sensor including: a field oxide layer in shape of a trench formed in a substrate to define an active region; a trench with a predetermined depth formed by removing a portion of the field oxide layer adjacent to the active region; a gate oxide layer formed on sidewalls of the active region exposed by the trench; a blocking layer formed on the active region; a gate electrode formed over the trench and the blocking layer; and a metal contact electrically connected to the gate electrode, wherein the metal contact is not electrically connected to the active region by the blocking layer.

In accordance with still further aspect of the present invention, there is provided a method for fabricating a CMOS image sensor including a reset transistor, a select transistor, a drive transistor and a photodiode, the method including: forming a plurality of field oxide layers in shape of a trench to define an active region; forming a blocking layer on the active region; forming a trench with a predetermined depth by removing a portion of the field oxide layer adjacent to the active region; forming a gate oxide layer on sidewalls of the active region exposed by the trench; forming a gate electrode over the trench and the blocking layer; and forming a metal contact electrically connected to the gate electrode, wherein the metal contact is not electrically connected to the active region by the blocking layer.

In accordance with yet further aspect of the present invention, there is provided a method for fabricating a CMOS image sensor including a transfer transistor, a reset transistor, a select transistor, a drive transistor and a photodiode, the method including: forming a plurality of field oxide layers in shape of a trench to define an active region; forming a blocking layer on the active region; forming a trench with a predetermined depth by removing a portion of the field oxide layer adjacent to the active region; forming a gate oxide layer on sidewalls of the active region; forming a gate electrode over the trench and the blocking layer; and forming a metal contact electrically connected to the gate electrode, wherein the metal contact is not electrically connected to the active region by the blocking layer.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A CMOS image sensor and a method for fabrication thereof in accordance with exemplary embodiments of the present invention will be described in detail with reference to the accompanying drawings.

Figure 3:
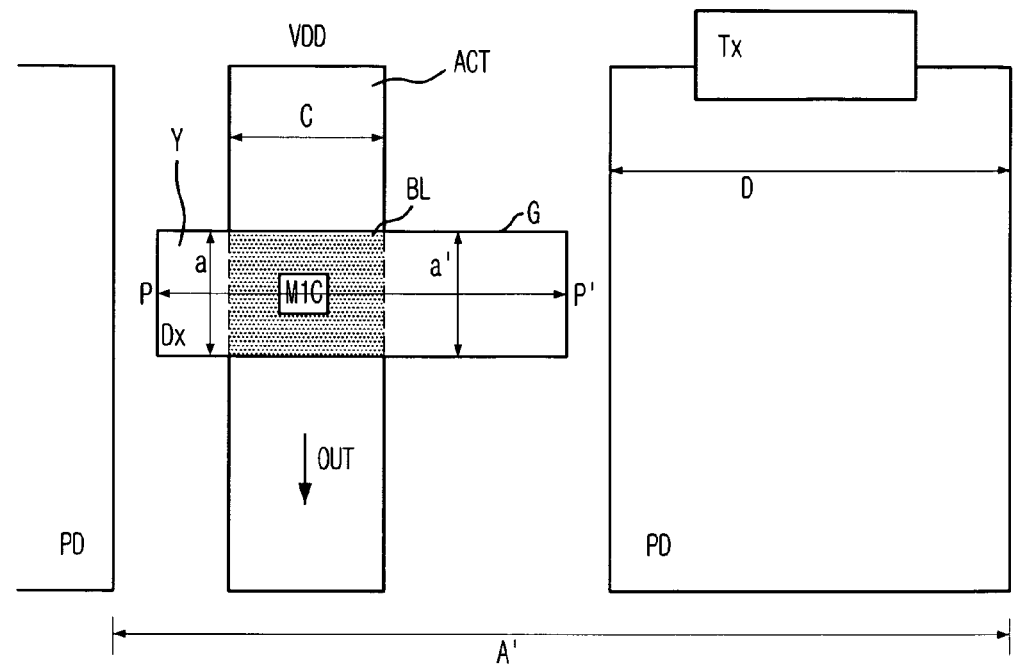
FIG. 3 is a plane view of a CMOS image sensor in accordance with one embodiment of the present invention.

FIG. 3 is a plane view of a CMOS image sensor in accordance with one embodiment of the present invention. An active region ACT is formed in shape of a line. A P-well (not shown) is arranged in a predetermined region in the active region ACT, and a drive transistor Dx is disposed over the P-well. The drain of the drive transistor Dx is connected to a power voltage VDD and a source of the select transistor (not shown) is connected to an output node (not shown). The drive transistor Dx incorporates a gate G crossing over the P-well. Square-shaped photodiodes PD are arranged on both sides of the active region ACT. A transfer transistor Tx is disposed on one side of the photodiode PD.

Meanwhile, a first metal contact M1C connected to a gate G of the drive transistor Dx is formed in a region that the drive transistor Dx and the active region ACT are overlapped with each other. To this end, a blocking layer BL is disposed between the gate G of the drive transistor Dx and the active region ACT, and the blocking layer BL prevents the first metal contact M1C from being connected to the active region ACT. In addition, the drive transistor Dx is formed as a FINFET so that it is possible to increase a channel length. Since the width of the channel satisfies an inequality condition, i.e., C<a+a', the channel length increases so that it is possible to suppress the rolling phenomenon of the threshold voltage.

Figure 1:
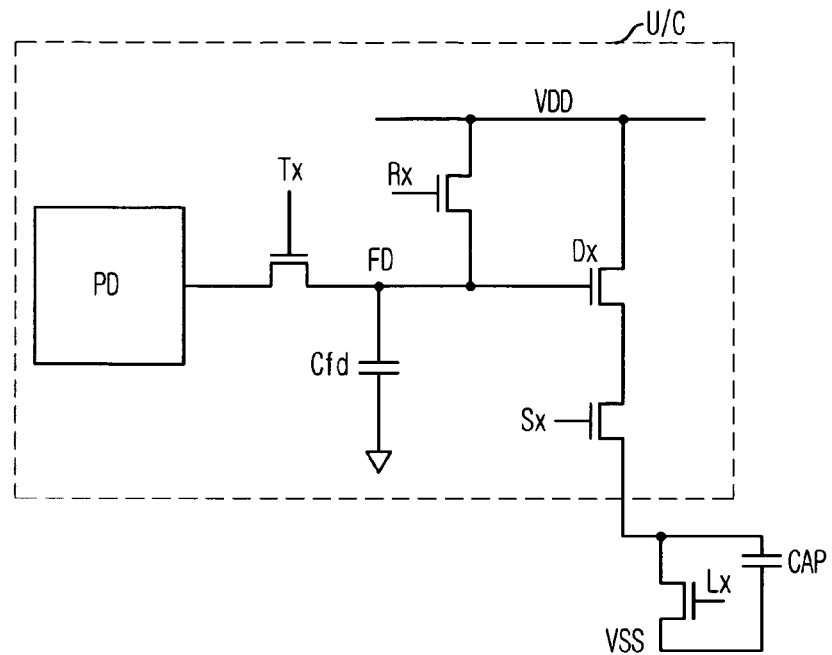
FIG. 1 is a circuit diagram setting forth a unit pixel of a conventional CMOS image sensor, in which one unit pixel includes four transistors.
Figure 2:
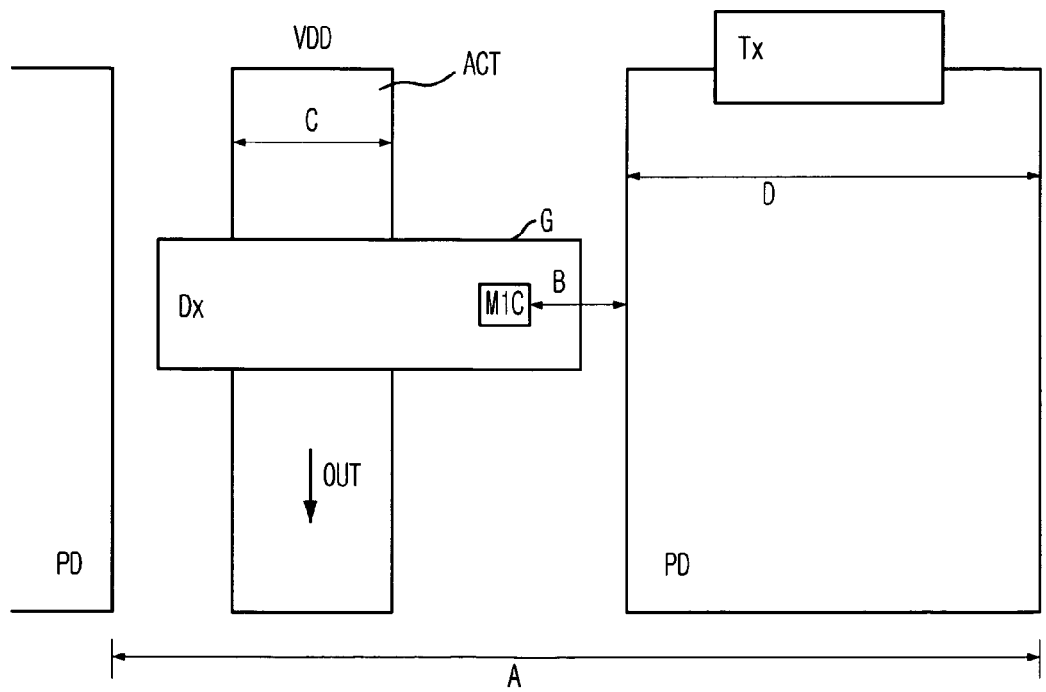
FIG. 2 is a plane view illustrating the conventional unit pixel of FIG. 1 including the drive transistor.

The blocking layer BL is disposed under the gate G of the drive transistor Dx. The first metal contact M1C is formed in the region that the drive transistor Dx and the active region ACT are overlapped with each other and is not connected to the active region ACT in virtue of the blocking layer BL. Therefore, a pixel size A' of the present invention becomes smaller than the pixel size A of the conventional unit pixel (FIG. 2) so that it is possible to scale down the image sensor. In addition, the gate G controlling the channel exists on both sides of the active region ACT so as to suppress the back bias effect. Resultingly, it is possible to enhance the matching property of the threshold voltage.

Figure 4:
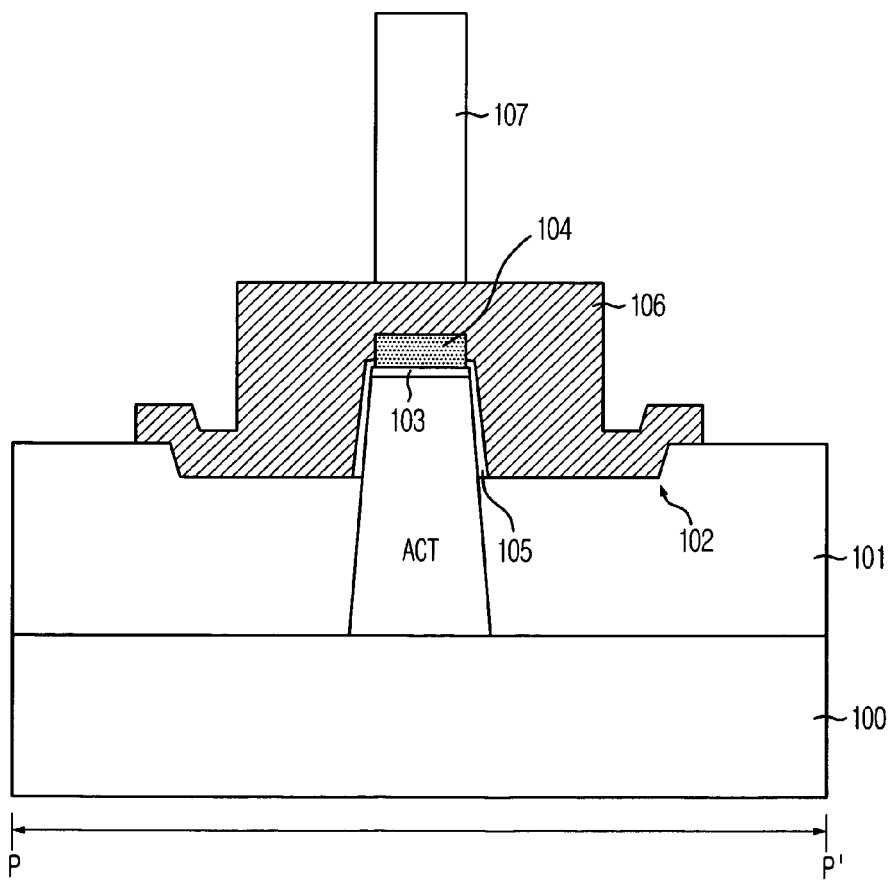
FIG. 4 is a cross-sectional view taken along the line P-P' of FIG. 3.

FIG. 4 is a cross-sectional view taken along the line P-P' of FIG. 3. Two field oxide layers 101 in shape of trench are disposed on predetermined regions of a substrate 100, wherein the two field oxide layers 101 are separated from each other by the active region ACT interposed therebetween. By means of the field oxide layers 101, the active region ACT is defined in the substrate 100. Each of the field oxide layers 101 is partially etched to form a trench 102 at a portion adjacent to the active region ACT. The blocking layer configured with an oxide layer 103 and a nitride layer 104 is formed such that the blocking layer covers the top surface of the active region ACT, wherein the active region ACT has a protruded shape because of the trench 102. A gate oxide layer 105 is disposed on both sidewalls of the active region ACT exposed by the trench 102. A gate electrode 106, which is patterned into a predetermined configuration, is formed on the entire surface including the trench 102, the gate oxide layer 105 and the blocking layer. A first metal contact 107 is formed over the active region ACT, wherein the first metal contact 107 is connected to the gate electrode 106 but is electrically insulated from the active region ACT by means of the blocking layer.

Figure 5:
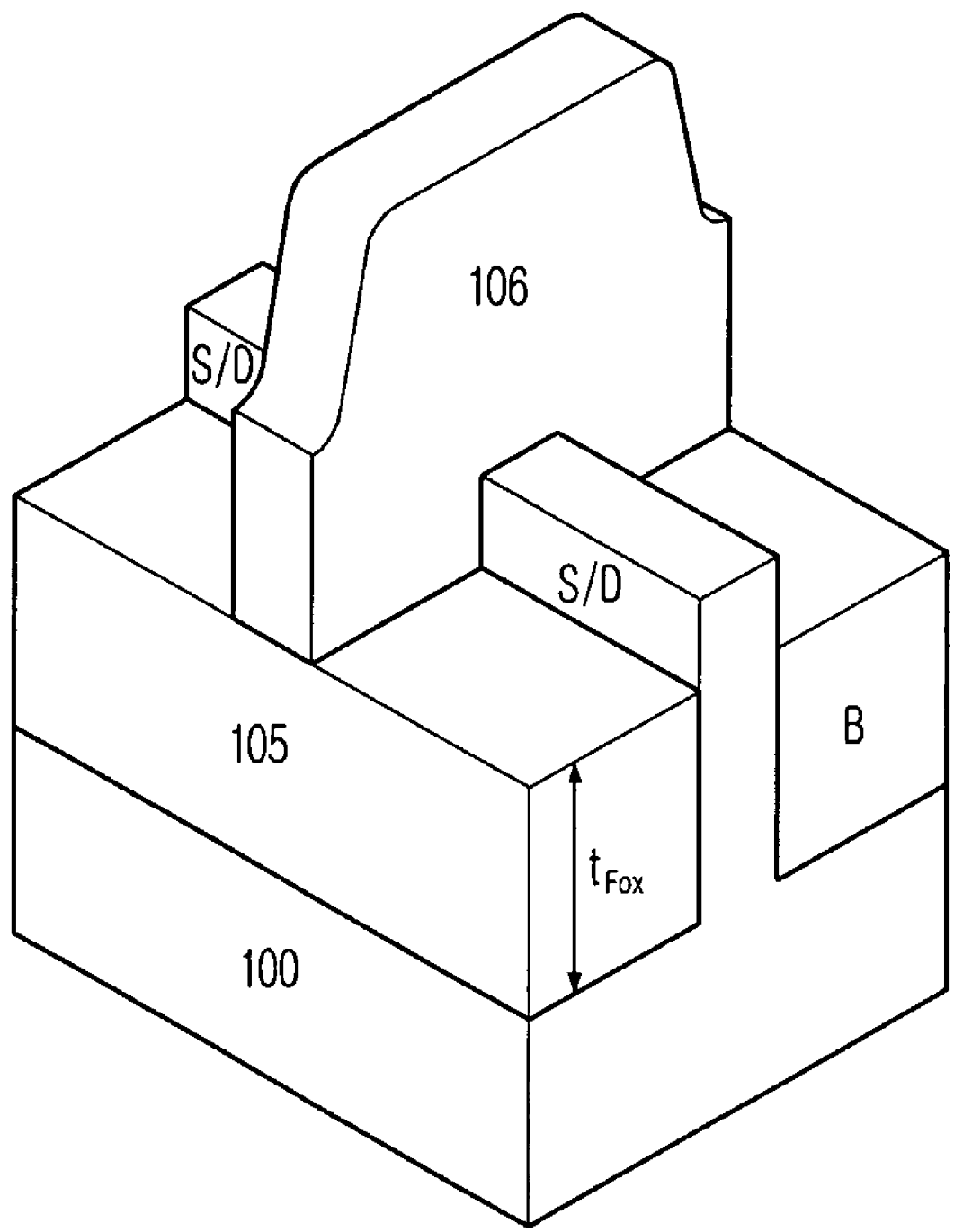
FIG. 5 is a perspective view illustrating a fin field effect transistor (FINFET) of a drive transistor in accordance with one embodiment of the present invention.

FIG. 5 is a perspective view illustrating a fin field effect transistor (FINFET) of a drive transistor in accordance with one embodiment of the present invention. In order to improve the device performance and minimize the leakage current, semiconductor manufacturers have researched new structures of the transistor which may be applied to a next generation semiconductor device of 100 nm or less. One of new structures is to employ a FINFET which has a high and thin channel like shark's fin. In the FINFET design, each side of the fin is used as a gate and thus, one fin provides two gates. Accordingly, it is easy to perform the switching of the device when employing the FINFET structure. Since the FINFET has such a double gate structure, the FINFET is also called a double gate MOSFET. A CMOS is horizontally constructed, whereas the FINFET is vertically constructed. Thus, the FINFET is an innovative and promising concept which can be applied to a highly integrated device. In addition, the FINFET may be fabricated using a standard CMOS process unlike the other double gate structures. Reference numerals 100 and 105 denote a substrate and a gate oxide layer, respectively. The FINFET having the constitution of FIG. 5 has several advantages such as low wafer cost, low defect density, no back bias, high heat transfer rate to the substrate, high process compatibility, and so forth.

Figure 6:
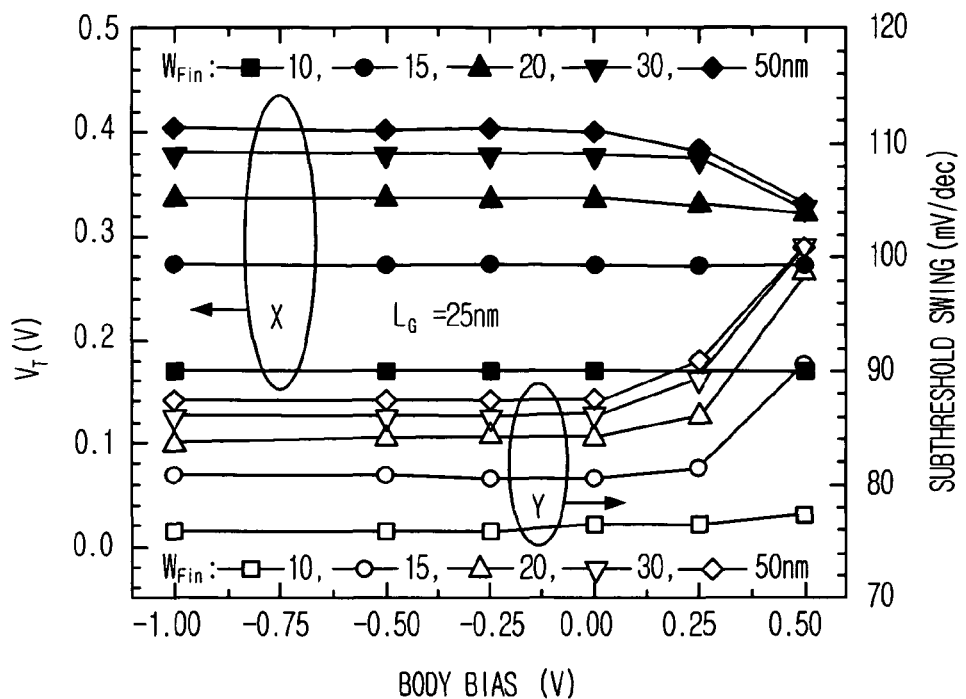
FIG. 6 is a graph illustrating a simulation result of measuring the back bias effect of the FINFET.
Figure 7:
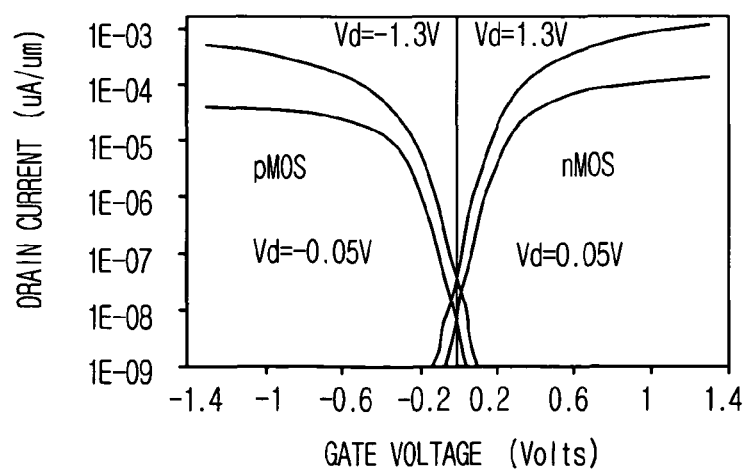
FIG. 7 is a graph illustrating a drain current variation versus a gate voltage of the FINFET.

FIG. 6 is a graph illustrating 3D simulation results of the back bias effect of the FINFET. For a gate having a length of 25 nm, an ellipse denoted with a reference letter 'X' represents variations of threshold voltage $V_T$ of the FINFET with respect to various body bias voltages for various active widths of the FINFET. Also, another ellipse denoted with a reference letter 'Y' represents variations of subthreshold swing, i.e., switching speed, with respect to various body bias voltages for various active widths of the FINFET. The FINFET shows less variation with respect to changing body bias voltages than a normal transistor in general as can be seen from the graph. Accordingly, the FINFET can lead an improved matching characteristic between transistors, and it is possible to obtain less variation between pixels constructed by FINFETs, resulting in an improved image noise characteristic. FIG. 7 is a graph illustrating a drain current variation versus a gate voltage of the FINFET. Referring to FIGS. 6 and 7, it is confirmed that the threshold voltage $V_T$ does not increase at a predetermined back bias.

FIGS. 8A to 8E are cross-sectional views setting forth a method for fabricating a drive transistor of a unit pixel of a CMOS image sensor in accordance with one embodiment of the present invention.

Figure 8A:
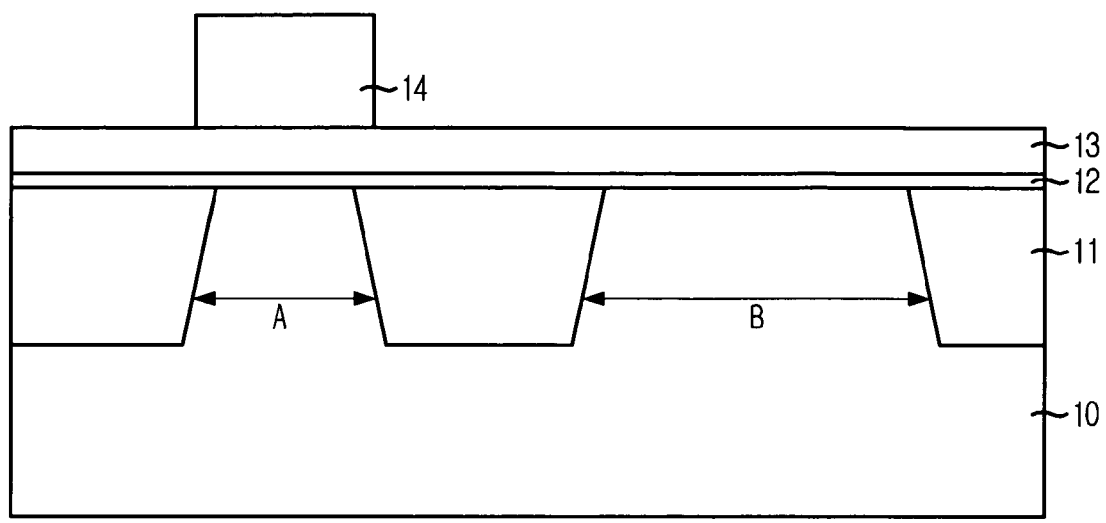
FIGS. 8A to 8E are cross-sectional views illustrating a method for fabricating the drive transistor of the unit pixel of the CMOS image sensor in accordance with one embodiment of the present invention.

Referring to FIG. 8A, a field oxide layer 11 in shape of trench is formed in predetermined regions of a substrate 10. In order to form the field oxide layer 11, the substrate 10 is etched to form a trench first and, thereafter, an oxide layer is filled into the trench and planarized. An active region is disposed between the field oxide layers 11, wherein denotations A and B represent an active region where a gate of the drive transistor with the FINFET structure will be formed (hereinafter, referred to as a gate region) and an active region where a photodiode will be formed (hereinafter, referred to as a photodiode region), respectively.

An oxide layer 12 and a nitride layer 13 are sequentially formed on the entire surface of the substrate 10 where the field oxide layer 11 is formed. The oxide layer 12 and the nitride layer 13 are used as a blocking layer. The blocking layer prevents a first metal contact from contacting the active region in the gate region A, wherein the first metal contact will be formed on the gate of the drive transistor disposed over the blocking layer. This will be more fully described later.

Although the double stacked structure with the oxide layer 12 and the nitride layer 13 is used as the blocking layer, a single layer of the oxide layer or the nitride layer or a multi-stacked structure of triple layers or more may also be used. It is preferable that the blocking layer is formed in a thickness ranging from approximately 10 Å to approximately 1,000 Å such that the blocking layer is not affected by a topology and an external voltage stress.

A photolithography process is performed to form a first photoresist pattern 14 for defining the gate region A of the drive transistor Dx. The first photoresist pattern 14 is formed to define the active region and regions around the active region. The gate region A is defined by selectively etching the blocking layer using the first photoresist pattern 14 as an etch mask. That is, the nitride layer 13 is selectively removed using the first photoresist pattern 14.

Figure 8B:
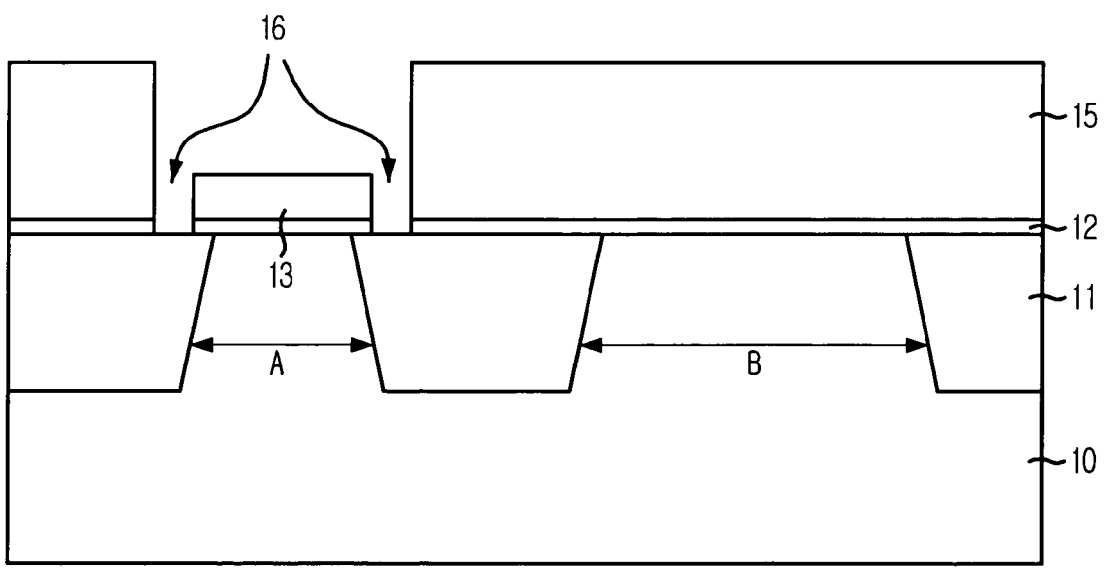

Referring to FIG. 8B, a second photoresist pattern 15 is formed such that the second photoresist pattern 15 exposes a portion of each field oxide layer 11 around the gate region A as well as the gate region A itself. The oxide layer 12 is selectively removed using the second photoresist pattern 15 as an etch mask. An opening 16 formed over the exposed field oxide layer 11 around the gate region A, i.e., the opening 16 over the field oxide layer 11 not covered with the second mask pattern 15, is a region for forming a channel of the FINFET in a following process.

Figure 8C:
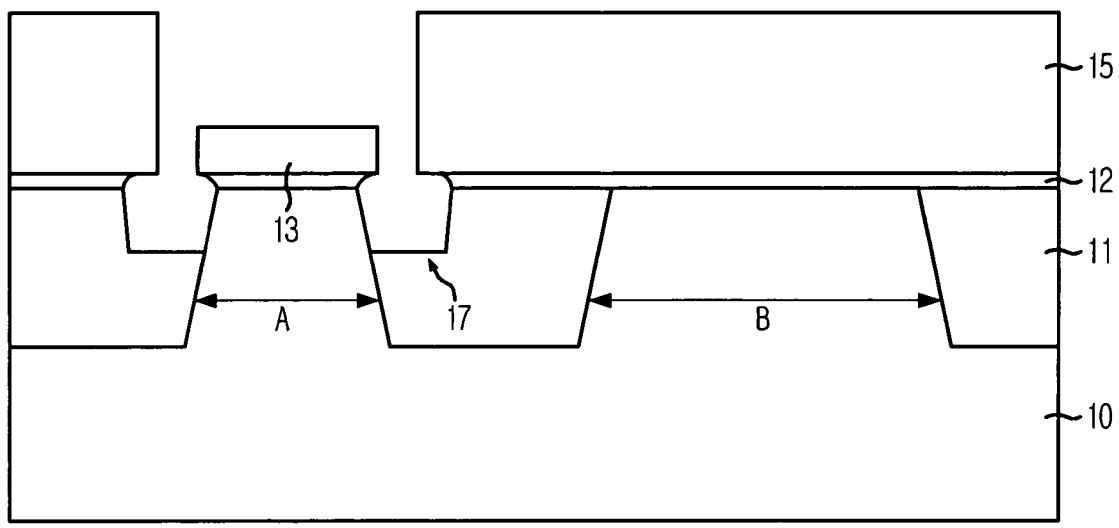

Referring to FIG. 8C, a portion of the field oxide layer 11 is etched using the second photoresist pattern 15 as an etch mask, and thus, the portion of the field oxide layer 11 around the gate region A is partially removed to form a trench 17 which is extended from the sidewall of the active region to a predetermined region of the field oxide layer 11.

The region for forming the trench 17 has a predetermined size in consideration of a minimum space between the active region of an adjacent photodiode and the gate region A which is allowed by the design rule. The etching may be performed using wet or dry process. The field oxide layer 11 may be etched to a predetermined depth corresponding to a channel depth. Thereafter, the second photoresist pattern 15 is removed by well-known removal process.

Figure 8D:
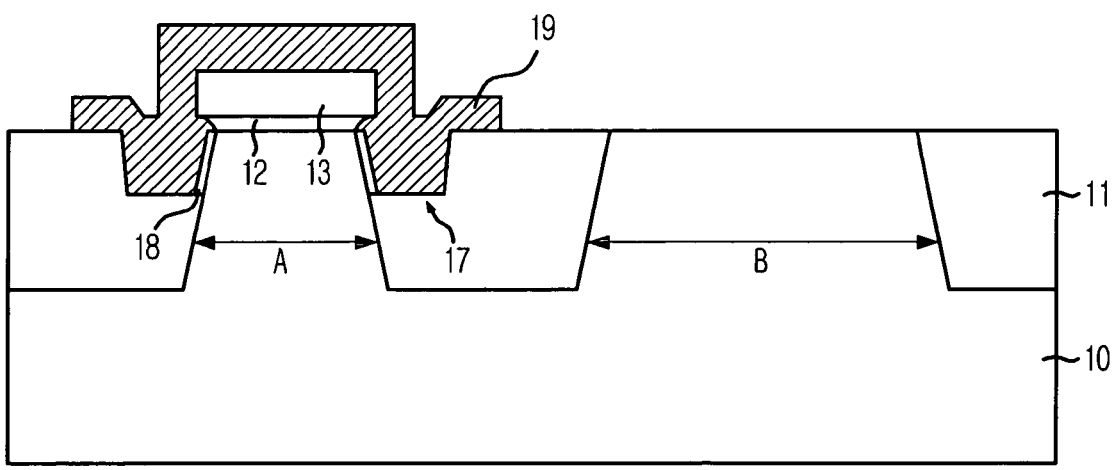

Referring to FIG. 8D, an oxidation process is performed to form a silicon oxide layer 18 on sidewalls of the active region exposed by the trench 17. The silicon oxide layer 18 is a gate oxide layer on which the channel will be formed. Since the channel of the FINFET is formed on the sidewalls of the field oxide layer 11, the silicon oxide layer is formed through the gate oxidation process such that the silicon oxide layer is equally grown on the top surface and sidewall of the active region.

After depositing a conductive layer on the entire surface of the resultant structure, the conductive layer is selectively etched to form a gate electrode 19. The gate electrode 19 is formed such that the gate electrode 19 is extended to a portion of the top surface of the field oxide layer 11 as well as the trench 17. The conductive layer may be formed of polysilicon, tungsten, etc.

Figure 8E:
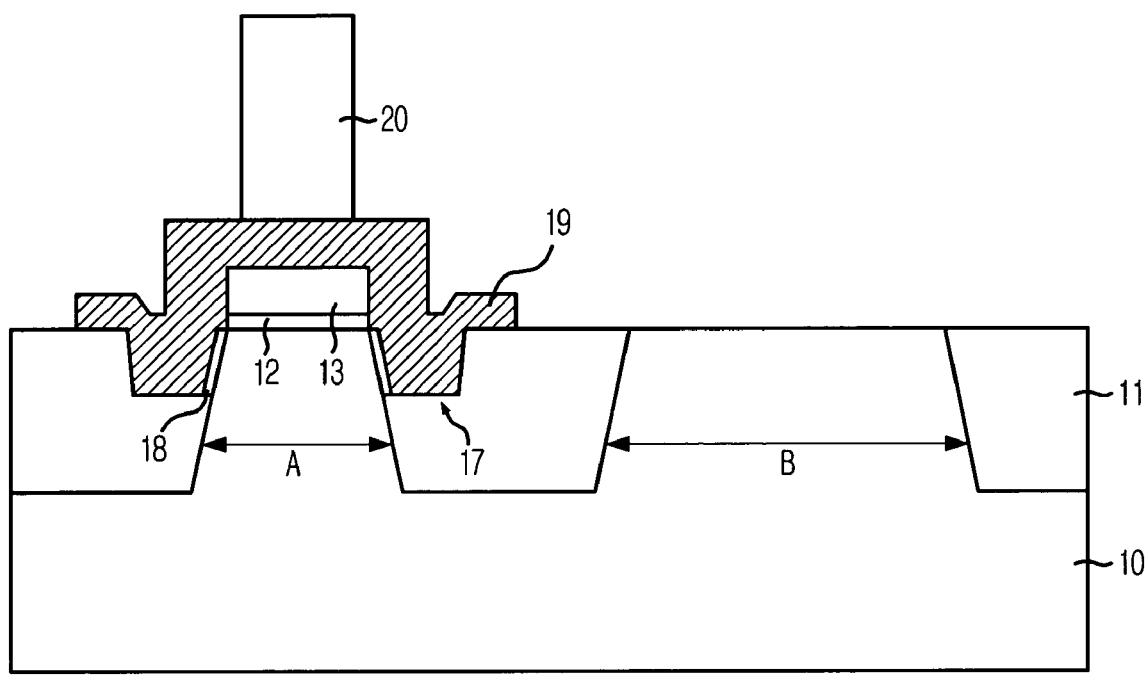

Referring to FIG. 8E, a typical process for forming the transistor such as a process of forming source/drain and a process for forming an interlayer insulating layer are performed. Thereafter, there is formed a first metal contact 20 which is electrically connected to the gate electrode 19 of the drive transistor. Since the blocking layer exits under the gate electrode 19, the first metal contact 20 is not electrically connected to the active region even though the first metal contact 20 is formed over the active region.

As described above, in accordance with the present invention, the drive transistor of the CMOS image sensor, which acts as a source follower, is embodied as the FINFET to thereby increase the width of the active region. Since the first metal contact connected to the gate of the drive transistor is formed over the active region, the matching property of the transistor is enhanced by reducing the back bias effect and further it is possible to scale down the device. As a result, the present invention provides an advantageous effect that a net die increases and a downsize image sensor can be implemented in virtue of reduction of the chip size. In the present invention, although the drive transistor of the CMOS image sensor is implemented as the FINFET, the other transistors may also be applied to the drive transistor.

The present application contains subject matter related to the Korean patent application No. KR 2005-52352, filed in the Korean Patent Office on Jun. 17, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A complementary metal-oxide semiconductor (CMOS) image sensor, comprising:
   an active region of a drive transistor, wherein the active region is in the shape of a line;
   a single gate insulation layer covering a vertical portion of a side of the active region;
   a gate electrode of the drive transistor, wherein the gate electrode intersects the active region;
   a blocking layer interposed between the active region and the gate electrode, wherein the blocking layer includes a stacked layer of oxide and nitride formed on a horizontal portion above the active region, wherein the single gate insulation layer is separate and distinct from the oxide in the blocking layer, wherein the single gate insulation layer covers a side of the oxide of the blocking layer, and wherein the single gate insulation layer covers only a portion of a side of the nitride of the blocking layer; and
   a metal contact electrically connected to the gate electrode, wherein the metal contact is formed above an intersection region of the active region and the gate electrode.

2. The CMOS image sensor of claim 1, further comprising a reset transistor, a selector transistor, and a photodiode.

3. The CMOS image sensor of claim 1, wherein the blocking layer has a thickness in a range of approximately 10 Å to approximately 1,000 Å.

4. A complementary metal-oxide semiconductor (CMOS) image sensor, comprising:
   a field oxide layer including first trenches formed in a substrate to define an active region;
   second trenches with a predetermined depth formed by removing a portion of the field oxide layer adjacent to the active region;
   a single gate oxide insulation layer covering a vertical portion of a side of the active region exposed by the second trenches;
   a blocking layer formed on a horizontal portion above the active region, wherein the blocking layer includes a stacked layer of oxide and nitride, wherein the single gate oxide insulation layer is separate and distinct from the oxide in the blocking layer, wherein the single gate oxide insulation layer covers a side of the oxide of the blocking layer, and wherein the single gate oxide insulation layer covers only a portion of a side of the nitride of the blocking layer;
   a gate electrode formed over the first and second trenches and the blocking layer; and
   a metal contact electrically connected to the gate electrode, wherein the metal contact is formed above an intersection region of the active region and the gate electrode.

5. The CMOS image sensor of claim 4, further comprising a reset transistor, a select transistor, a drive transistor, and a photodiode.

6. The CMOS image sensor of claim 4, wherein the blocking layer has a thickness in a range of approximately 10 Å to approximately 1,000 Å.

7. The CMOS image sensor of claim 5, wherein the gate electrode is a gate electrode of the drive transistor.

8. The CMOS image sensor of claim 1, wherein the oxide of the blocking layer is disposed between the horizontal portion of the active region and the nitride of the blocking layer.

9. The CMOS image sensor of claim 1, wherein the gate electrode contacts the nitride of the blocking layer and the single gate insulation layer, and wherein the oxide of the blocking layer is separated from the gate electrode by the nitride of the blocking layer and the single gate insulation layer.

10. The CMOS image sensor of claim 1, wherein the blocking layer is configured to prevent the metal contact from connecting to the active region.

11. The CMOS image sensor of claim 1, wherein the metal contact is electrically insulated from the active region by the blocking layer.

12. The CMOS image sensor of claim 4, wherein the oxide of the blocking layer is disposed between the horizontal portion of the active region and the nitride of the blocking layer.

13. The CMOS image sensor of claim 4, wherein the gate electrode contacts the nitride of the blocking layer and the single gate oxide insulation layer, and wherein the oxide of the blocking layer is separated from the gate electrode by the nitride of the blocking layer and the single gate oxide insulation layer.

14. The CMOS image sensor of claim 4, wherein the blocking layer is configured to prevent the metal contact from connecting to the active region.

15. The CMOS image sensor of claim 4, wherein the metal contact is electrically insulated from the active region by the blocking layer.

16. A complementary metal-oxide semiconductor (CMOS) image sensor, comprising:
an active region;
a gate insulation layer abutting a portion of the active region;
a gate electrode intersecting the active region;
a blocking layer interposed between the active region and the gate electrode, wherein the blocking layer includes an oxide layer and a nitride layer both of which are above the active region, wherein the gate insulation layer is separate and distinct from the oxide layer, wherein the gate insulation layer abuts an entire side of the oxide of the blocking layer, and wherein the gate insulation layer abuts only a portion of the side of the nitride of the blocking layer; and
a metal contact electrically connected to the gate electrode.

17. The CMOS image sensor of claim 16, wherein the oxide layer is disposed between the active region and the nitride layer.

18. The CMOS image sensor of claim 16, wherein the gate electrode contacts the nitride layer and the gate insulation layer, and wherein the oxide layer is separated from the gate electrode by the nitride layer and the gate insulation layer.

19. The CMOS image sensor of claim 16, wherein the blocking layer is configured to prevent the metal contact from connecting to the active region.

20. The CMOS image sensor of claim 16, wherein the metal contact is electrically insulated from the active region by the blocking layer.

* * * * *